(12) United States Patent
Aemireddy et al.

(10) Patent No.: US 7,425,867 B2
(45) Date of Patent: Sep. 16, 2008

(54) DIFFERENTIAL INPUT/DIFFERENTIAL OUTPUT CONVERTER CIRCUIT

(75) Inventors: Arvind R. Aemireddy, Irving, TX (US); Robert J. Wimmer, Hastings, MN (US); Cameron Carroll Rabe, Inver Grove Heights, MN (US); Jeffrey A. Gleason, Burnsville, MN (US)

(73) Assignee: Agere Systems Inc., Allentown, PA (US)

( * ) Notice: Subject to any disclaimer, the term of this patent is extended or adjusted under 35 U.S.C. 154(b) by 561 days.

(21) Appl. No.: 11/241,874

(22) Filed: Sep. 30, 2005

(65) Prior Publication Data

US 2007/0075688 A1  Apr. 5, 2007

(51) Int. Cl.
*H03F 3/45* (2006.01)

(52) U.S. Cl. .................... 330/257; 330/261

(58) Field of Classification Search ............. 330/253, 330/255, 257, 261
See application file for complete search history.

(56) References Cited

U.S. PATENT DOCUMENTS

| 6,316,998 B1 * | 11/2001 | Oikawa ............ 330/255 |
| 6,392,485 B1 * | 5/2002 | Doi et al. ............ 330/253 |
| 6,778,014 B2 * | 8/2004 | Rennig ............ 330/253 |

* cited by examiner

*Primary Examiner*—Henry K Choe
(74) *Attorney, Agent, or Firm*—Priest & Goldstein, PLLC

(57) ABSTRACT

A differential input/differential output converter circuit. The circuit comprises differential complementary input modules each comprising cross-coupled devices for biasing current mirror masters to a condition that increases the operating speed in response to a transition in the differential input signals. Certain current mirror masters are biased to a strong threshold condition and other current mirror masters are biased to a weak threshold condition responsive to a state of the differential input signals. According to another embodiment, the converter circuit further comprises a boost circuit capacitively coupled to the converter circuit for providing further speed improvements.

42 Claims, 6 Drawing Sheets

DIFFERENTIAL INPUT/DIFFERENTIAL OUTPUT CONVERTER CIRCUIT

FIELD OF THE INVENTION

The present invention relates generally to a voltage converter circuit for receiving differential voltage input signals and supplying differential voltage output signals, and more particularly to such a circuit for use in high data rate applications, for example, in a write data path of a disk drive data storage system.

BACKGROUND OF THE INVENTION

Disk drives are widely accepted as a cost effective data storage system for a computer, music player, or other data processing devices. As shown in FIG. 1, a disk drive system 10 comprises a magnetic recording medium, in the form of a disk or platter 12 having a hub 13 and a magnetic read/write transducer 14, commonly referred to as a read/write head. The read/write head 14 is attached to or formed integrally with a suspension arm 15 suspended over the disk 12 and affixed to a rotary actuator arm 16. A structural arm 18, supported by a platform 20, is pivotably connected to the actuator arm 16 at a pivot joint 22. A voice coil motor 24 drives the actuator arm 16 to position the head 14 over a selected position on the disk 12.

As a spindle motor (not shown) rotates the disk 12, the moving air generated by the rotating disk in conjunction with the physical features of the suspension arm 15 lifts the read/write head 14 away from the platter 12, allowing the head 14 to glide or fly on a cushion of air slightly above an upper surface of the disk 12. The flying height of the read/write head 14 over the disk surface is typically less than a micron.

An arm electronics module 30 may include circuits that switch the head function between read and write operations, a write driver for supplying write current to the head 14 during write operations and an amplifier for amplifying the read signal. The arm electronics module 30 is connected to the head 14 by flexible conductive leads 32

The configuration and components of the electronics module 30 may vary according to the disk drive design as will be understood by persons familiar with such technology. Although the module 30 may be mounted anywhere in the disk drive 10, a location proximate the head 14 minimizes signal losses and induced noise in the head signals during a read operation. A preferred mounting location for the module 30 comprises a side surface of the structural arm 18 as shown in FIG. 1.

As shown in a partial cross-sectional schematic view in FIG. 2, the disk 12 comprises a substrate 50 and a thin film 52, disposed thereover. The magnetic transducer or head 14 comprises a write head 14A for writing data bits to the disk 12 by altering magnetic domains of ferromagnetic material in the film 52, thereby creating magnetic transitions in the magnetic domains. A read head 14B reads the magnetic transitions to determine the stored data bit.

Data bits and timing information to be written to the disk 12 are supplied by a data processing device 60 (e.g. a computer or music player), in the form of bipolar data pulses in PECL (positive emitter-coupled logic) form. Typically, the PECL bipolar signals representing a logic one and a logic zero differ by about 200 mV or about 450 mV. The incoming data pulses have an absolute voltage of about 2.85V and about 3.3V for a 450 mV differential PECL signal and about 3.1V and about 3.3V for a 200 mV differential PECL signal. The data and timing pulses are supplied to a data write circuit 62 where the data bits are formatted and error detection/correction information appended thereto.

To write data bits, the voice coil motor 18 moves the suspension arm 16 to a desired radial position above the surface of the disk 12 while the spindle motor rotates the disk 12 to move a circumferential region to be written under the write head 14A. A write driver 66A of a preamplifier 66 (in one embodiment disposed within the electronics module 30) supplies a programmed write current (in certain applications between about 10 mA and 70 mA) to the write head 14A responsive to the signal from the data write circuit 62. The write driver 66A scales up the relatively low voltage levels representing the data bits to a voltage range between about +/−6V and +/−10V. In one embodiment the write driver 66A converts the PECL signals to logic signals having a larger differential voltage, such as about 3.3V. Typical absolute voltages are −1.7V to −5.0V with a 3.3V differential or 1.7V to 5.0V with a 3.3V differential. The voltage conversion is desired to properly drive metal-oxide semiconductor field effect transistors (MOSFETS) (not shown) that supply write current to the write head 14B. The write driver 66A also shapes the write current signal waveform to optimize the data writing process.

Write current supplied by the write driver 66A to the write head 14A (magnetically coupled to a magnetically permeable core not shown) creates a magnetic field that extends from the core across an air gap between the write head 14A and the disk 12. The magnetic field alters a region of ferromagnetic domains in the thin film 52 to store the data bits as magnetic transitions.

The direction of the magnetic field generated by the write head 14A, and thus the direction of the altered ferromagnetic domains, is responsive to the direction of current flow through the write head 14A. Current supplied in a first direction through the write head 14A causes the domains to align in a first direction (representing a date 0 for example) and current supplied in a second direction (representing a data 1 for example) causes the domains to align in a second direction.

In the read mode transitions between adjacent domains are detected to determine the stored data bit. The read head 14B (comprising either a magneto-resistive (MR) sensor or an inductive sensor) senses the magnetic transitions in the thin film 52 to detect the stored data bits. The MR sensor produces a higher magnitude output signal in response to the magnetic transitions, and thus the output signal exhibits a greater signal-to-noise ratio than an output signal produced by the inductive sensor. The MR sensor is thus preferred, especially when a higher a real data storage density is desired. State-of-the-art MR read heads include giant magnetoresistive (GMR) heads and tunneling magnetoresistive (TMR) heads.

The suspension arm 16 moves the head 14 while the disk 12 rotates to position the read head 14B above a magnetized region to be read. A DC (direct current) bias voltage of between about 0.025V and about 0.3V is supplied to the read head 14B by a read circuit 66B of the preamplifier 66. Magnetic domains in the thin film 52 passing under the read head 14B alter a resistance of the magneto-resistive material, imposing an AC (alternating current) component on the DC bias voltage. The AC component representing the read data bits has a relatively small magnitude (e.g., several millivolts) with respect to the DC bias voltage.

The differential read circuit output signal, having an amplitude in a range of several millivolts, is input to a signal processing stage 102 followed by an output or converter stage 104. Typically, both the signal processing stage 102 and the output stage 104 are elements of the preamplifier 66. The signal processing stage 102 amplifies the signal to increase the signal's signal-to-noise ratio. The output stage 104 scales up the head signal voltage to a peak voltage value in a range of several hundred millivolts, supplying the scaled-up signal to channel circuits of a channel chip 106 through an interconnect 108. The channel chip 106 detects the read data bits from the voltage pulses, while applying error detection and correction processes to the read data bits. The read data bits are returned to the processing device 60 via a user interface 110 (e.g., SATA, SCSI, SAS, PCMCIA interfaces).

In other data storage systems the head 14 operates with different types of storage media (not shown in the Figures) comprising, for example, a rigid magnetic disk, a flexible magnetic disk, magnetic tape and a magneto-optical disk.

To increase storage capacity, a disk drive may comprise a plurality of stacked parallel disks 12. A read/write head is associated with each disk to write data to and read data from a top and bottom surface of each disk.

BRIEF SUMMARY OF THE INVENTION

According to one embodiment, the presenting invention comprises a voltage converter responsive to a differential input signal comprising a first and a second input signal, the converter for producing a differential output signal in response to the differential input signal. The converter comprises: a first input module responsive to the first and the second input voltages; a second input module responsive to the first and the second input voltages; a first and a second current supplying module, the first input module biases the first current supplying module at a first voltage to cause a first current through the first current supplying module and biases the second current supplying module at a second voltage to cause a second current through the second current supplying module, and wherein the first current is smaller than the second current; a third and a fourth current supplying module, wherein the second input module biases the third current supplying mirror at a third voltage to cause a third current through the third current supplying module and biases the fourth current supplying module at a fourth voltage to cause a fourth current through the fourth current supplying module, and wherein the fourth current is smaller than the third current; and wherein the differential output voltage comprises a first and a second output voltage responsive to the first, second, third and fourth currents.

According to another embodiment, the present invention comprises a method for controlling a voltage converter responsive to a differential input signal for producing a differential output signal in response thereto. The method further comprises: responsive to a first state of the differential input signal, controlling a first and a third current supplying module to a first "on" condition to supply a first current and controlling a second and a fourth current supplying module to a second "on" condition to supply a second current, wherein the first current is larger than the second current; producing the differential output signal having a first state responsive to the condition of the first, second, third and fourth current supplying modules; responsive to a second state of the differential input signal, controlling the first current supplying module to the second "on" condition to supply the second current and controlling the second current supplying module to the first "on" condition to supply the first current; producing the differential output signal having a second state responsive to the condition of the first, second, third and fourth current supplying modules.

BRIEF DESCRIPTION OF THE DRAWINGS

The present invention can be more easily understood and the advantages and uses thereof more readily apparent when the following detailed description of the present invention is read in conjunction with the figures wherein.

In accordance with common practice, the various described device features are not drawn to scale, but are drawn to emphasize specific features relevant to the invention. Reference characters denote like elements throughout the figures and text.

DETAILED DESCRIPTION OF THE INVENTION

Before describing in detail the particular method and apparatus related to differential input/differential output voltage converter circuits according to the present invention, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

Figure 3:
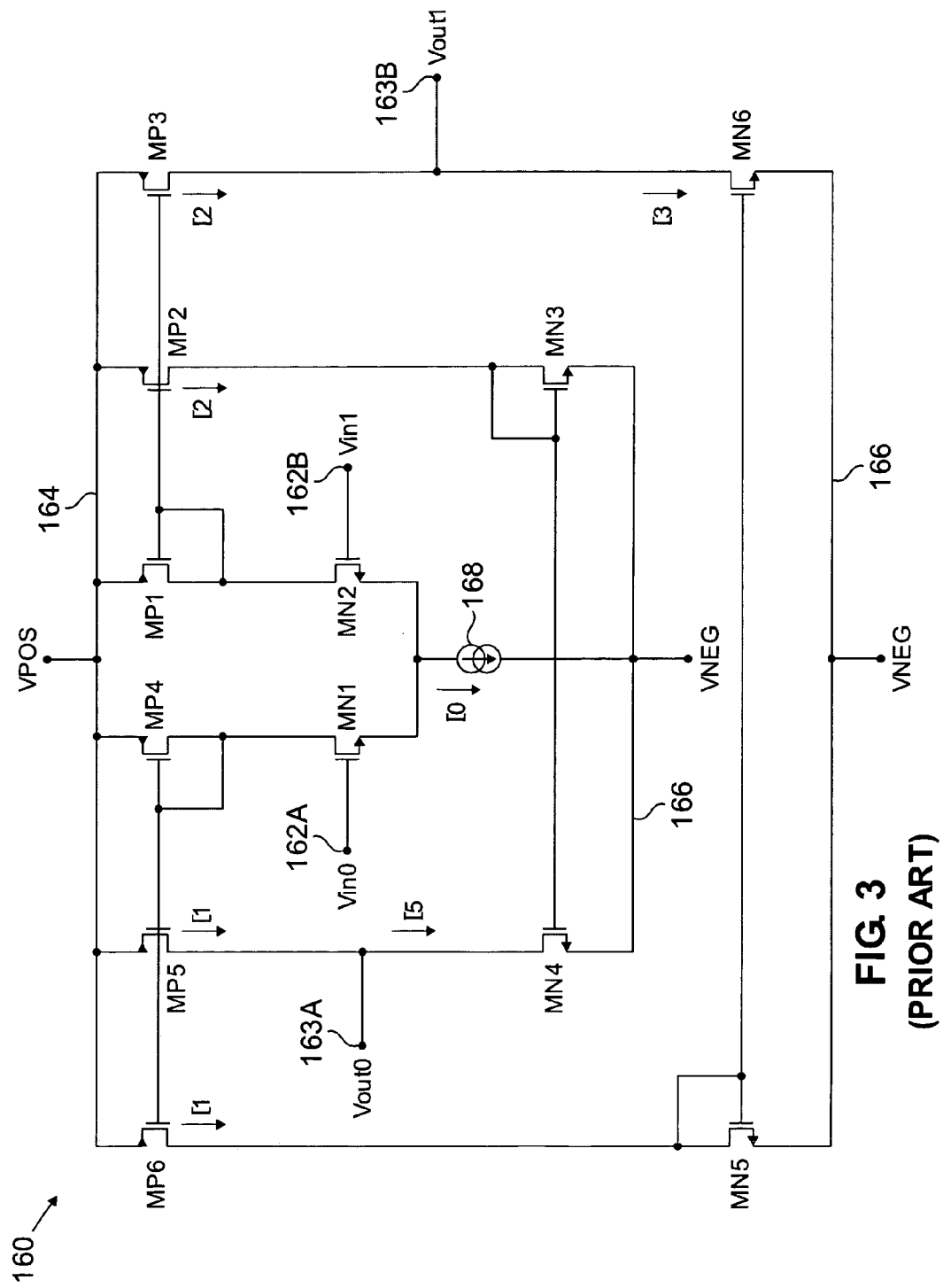
FIG. 3 is a schematic diagram of a prior art differential input/differential output converter circuit for use in conjunction with the disk drive of FIG. 1.

A prior art differential input/differential output voltage converter 160 (also referred to as a voltage level shifter circuit) is illustrated schematically in FIG. 3. According to know principles, a conventional differential amplifier amplifies a difference between two input signals. Ideally any signal that is common to the two input signals (i.e., a common mode signal) has no effect on the output signal. In practice, a common mode rejection ratio of the amplifier indicates the degree to which common mode signals are rejected, or conversely, affect the output signal.

The prior art differential input/differential output converter 160, disposed in the write data path (e.g., within the write driver 66A of FIG. 1) of the hard disk drive storage system 10, operates as a differential amplifier, producing a differential output based on the difference between two input signals. The converter 160 converts an input differential voltage in the form of input signals Vin0 and Vin1, as applied to input terminals 162A and 162B respectively, to an output logic signal (Vout0 and Vout1 at respective output terminals 163A and 163B) having a voltage that switches between a positive voltage rail 164 (VPOS) and a negative voltage rail 166

(VNEG), in response to the input differential voltage. Thus the converter 160 is referred to as a converter or level shifting circuit for converting a relatively small voltage difference between the input signals Vin0 and Vin1 to a larger voltage difference between the output signals Vout0 and Vout1.

One embodiment of the converter 160 accommodates input signals Vin0 and Vin1, as supplied on respective differential input terminals 163A and 163B, having a differential voltage of between about 200 mV to about 500 mV. In one application, the input signals represent data bits to be written to the disk 12 of FIG. 1. The output terminals 164A and 164B provide the corresponding differential output voltage levels Vout0 and Vout1 that are pulled either to the positive voltage rail 164 (in one embodiment a voltage of about 3.3V) or a voltage on a negative voltage rail 166. In another embodiment the negative voltage rail 166 is connected to ground, pulling the differential output voltages Vout0 and Vout1 to either the positive voltage rail 164 or to ground. It is known by those skilled in the art that different voltages on the positive and negative voltage rails can be used, with corresponding changes in the output voltages Vout0 and Vout1. According to one embodiment where the MOSFETS of the converter 160 have a breakdown voltage of 3.3V, the positive voltage rail is 3.3V above the negative voltage rail.

The differential output signals Vout0 and Vout1 drive MOSFET gates in a writer head cell (not shown) into a hard conduction state or a hard off state. Current sources controlled by a state of the MOSFETS supply the write current to the write head 14A for writing the data bits to the disk 12 of FIG. 1. To produce the write current, it is necessary to drive the MOSFET gates with voltages larger than the differential input voltages Vin0 and Vin1, and thus the need for the converter 160.

Within the converter 160, MOSFETS MN1 and MN2 are configured as an input differential pair and driven from a preceding buffer stage (not shown) that provides the complimentary PECL input signals Vin0 and Vin1. One of the MOSFETS MN1 or MN2 is gated "on" in response to the complimentary input signals Vin0 and Vin1 and the other is gated "off." While it possible for both the MOSFETS MN1 and MN2 to be "on" during transient operation, in a steady state condition, which is of import here, only one of the MOSFETS MN1 or MN2 is "on".

A current source 168 supplies a current I0 through a channel of the "on" MOSFET MN1 or MN2. The magnitude of the current I0 is selected based on an expected range of the differential mode and common mode components of the signals Vin0 and Vin1 that drive the MOSFETS MN1 and MN2. Further, I0 is selected to permit the "on" MOSFET MN1 or MN2 to operate in a saturation region and avoid operation in a triode region (where the MOSFET operates as a resistor). Since the "on" current also flows through MOSFET MP4 or MP1, I0 is selected to ensure that MP4 and MP1 also operate in the saturation region, but without reducing the current through MN1 and MN2 to a value that causes the MOSFETS MN1 and MN2 to revert to triode region operation.

When Vin0 is greater than Vin1 (where greater implies more positive when the input terminals 162A and 162B are connected to NMOSFET device gates), the MOSFET MN1 is "on" and gates on a current mirror master MOSFET MP4. The current I0 flows through a channel of the MOSFET MN1 and a channel of the current mirror master MOSFET MP4. Under this condition there is substantially no current flow through the MOSFET MN2.

In addition to turning on the current mirror master MP4, the MOSFET MN1 also gates "on" current mirrors MP5 and MP6 that mirror the current I0 as current I1. The physical characteristics (e.g., channel length and width) of the current mirror MOSFETS MP5 and MP6 are selected to provide a current I1 that is fractionally related to the current I0. Such current ratioing may be desired to lower the power consumption of the converter components and to permit use of physically smaller components.

When the MOSFET MP6 turns "on," a gate of the MOSFET MN5 is driven positive with respect to its source to turn "on" MN5. MN5 operates as a current mirror master with respect to MN6, which mirrors the current I1 to a current I3 through MN6.

Since the MOSFET MN2 is off in response to the input signal, the current through MN2 is substantially zero and the current through a channel region of the MOSFET MP1 is also substantially zero. MOSFETS MP2 and MP3 are also "off" and a mirrored current I2 through a channel region of the MOSFETS MP2 and MP3 is substantially zero.

Since MP2 is "off" a current mirror master MOSFET MN3 is "off. Because the MOSFET MN3 is the current mirror master for a MOSFET MN4, there is no current flow through the latter, i.e., I5 is substantially zero.

The output conditions of the converter circuit 160 are as follows. The current I1 through MP5 produces a voltage substantially equal to the voltage on the positive voltage rail 164 at the output terminal 163A, i.e., Vout0 is substantially equal to the positive rail voltage.

Since the current I2 is substantially zero, the current I3 through the MOSFET MN6 pulls the voltage at the output terminal 163B to substantially the negative rail voltage 166, i.e., Vout1 is substantially equal to the negative rail voltage.

Thus the converter 160 converts a differential input signal (Vin0 and Vin1) having a relatively small differential magnitude to a differential output signal having a relatively large differential magnitude determined by the voltage difference between the positive rail voltage 164 and the negative rail voltage 166.

When the voltage Vin0 on the input terminal 162A is less than the voltage Vin1 on the input terminal 162B, MN1, MP4, MP5 and MP6 are "off" and MN2, MP1, MP2 and MP3 are "on." The mirrored current I1 through MP5 and MP6 is substantially zero. The current I3 through the current mirror MN6 is also zero since no current is supplied to the current mirror master MN5. The current I2 through the MOSFETS MP2 and MP3 is non-zero. The current mirror master MN3 mirrors the current I2 to the current mirror MN4 for producing the current I5. As a result, Vout0 is pulled to the voltage on the negative voltage rail 166 and the Vout1 is pulled to the voltage on the positive voltage rail 164.

It is known that the converter 160 exhibits several different timing delays during the process of switching output states in response to input signal transitions.

A delay occurs between an input signal transition and a later time when the "on" MOSFETS (either the pair MN1/MP4 or the pair MN2/MP1) reach a full "off" state. While the "on" MOSFETS are turning "off," there is a delay between the input signal transition and a later time when the "off" MOSFETS reach a fill "on" steady state condition. Typically, the delay associated with turning "on" a MOSFET is longer than the delay associated with turning "off" the MOSFET. These delays slow the output transition process and may result in unacceptable operation (dropping bits) at high data rates. Any difference in the on-to-off and the off-to-on delays can cause operational asymmetries (i.e., bit pattern dependent delays) in the converter 160 as described further below. The detailed charging/discharging processes of MOSFET parasitic capacitances that create these delays are also described below.

When MN1 and MP4 are driven from an "on" state to an "off" state a delay is encountered as a state of MP4 passes through two operating regions until the gate reaches its steady state "off" voltage, i.e., the positive rail voltage. With the MOSFET MP4 initially "on" its gate-source voltage is Vgs=−(Vt+I0* L/(kW)), where k is a known constant, L and W are the channel length and width and Vt is the threshold voltage of MP4. Vgs is negative (i.e., the gate is at a lower voltage than the source) as required to sustain an "on" condition for MP4.

In response to an input signal transition from Vin0>Vin1 to Vin0<Vin1, MN1 is gated "off," the current through MN1 decreases to zero and MP4 losses its bias current. But MP4 continues to conduct current (according to the standard diode equation and a first time constant) to charge (in a positive direction) MP4's parasitic gate-source capacitor, that is, to charge the MP4 gate until a gate-source voltage is equal to the MP4 threshold voltage (where the threshold voltage is a negative value for the PMOSFET MP4). When this condition is reached MP4 begins to turn off. The gate-source capacitor continues to charge (according to the MOSFET square law equation and a second time constant) through a weakly inverted MP4 channel until the gate-source capacitor charges to the positive rail voltage to which the source is connected. Since the gate of MP4 is charged to the positive rail voltage and the MP4 source is connected to the positive rail voltage, the MP4 gate-source voltage is zero and MP4 is hard "off."

Since there is relatively little drive current for a MOSFET in weak inversion (a high resistance condition) the parasitic capacitors of the MOSFET MP4 operating in conjunction with this relatively high resistance exhibit a very long time constant. Also, the second charging time constant described above is longer than the first time constant due to the smaller charging current associated with the second charging process. These charging time constants cause the delay in turning MP4 fully "off" in response to the aforementioned input signal transition.

The gate-source voltage of MP4 ultimately settles to a voltage defined by the current through MN1 since that is the only DC current path. However, this is not the only current path during transitions because current also flows into MOSFET parasitic capacitors during the transitions. But once the transition effects have ended and the parasitic capacitors are fully charged (or discharged), the gate-source voltage of MP4 is determined solely by the current through MN1.

The various current mirror masters and current mirror MOSFETS of the converter 160 undergo similar transitional charging or discharging processes when the MOSFET switches from an "on" to an "off" state. In the "off" state, the MOSFET gate is charged to the rail voltage to which the MOSFET source is connected, that is, either the positive voltage rail 164 or the negative voltage rail 166.

A delay between an input signal transition and an output signal transition also occurs when MN1 and MP4 (or MN2 and MP1) are driven from an "off" to an "on" state. When MN1 and MP4 are "off," the gate-source voltage of MP4 is approximately zero (the gate is charged to the positive rail voltage as described above). Since MP4 is off, the MOSFETS MP5 and MP6 are "of" Each of the MOSFETS MP4, MP5 and MP6 has a small parasitic gate-source capacitance, a small parasitic gate-to-tub capacitance and a small parasitic gate-to-drain capacitance (but the MOSFET MP4 does not exhibit the gate-to-drain capacitance since its gate and drain are externally connected).

In response to an input signal transition that gates MN1 "on," current begins to flow through MN1 to turn MN1 "on." Current also flows through the gate-source parasitic capacitance of MP4 and the other parasitic capacitances of MP4, MP5 and MP6 as identified above. The current causes the gate of MP4 to discharge to one threshold voltage below the positive rail voltage, at which point MP4 begins to turn "on" because the MP4 gate is now negative with respect to the source in an amount equal to its threshold voltage. As MP4 begins to turn on, charge accumulates in the channel region under the gate and the gate capacitance increases. The gate of MP4 is pulled toward the negative rail voltage (the gate is becoming more negative with respect to the source that is held at the positive rail voltage) through the source-drain path of MN1 to support the current I0 through the source-drain path of MP4. Eventually MP4 reaches its full "on" steady state condition and current I0 flows through the source-drain path of MP4 and the source-drain path of MN1. As is known, when the MP4 gate-source voltage reaches the threshold voltage, the charging time constant increases because the gate capacitance has increased, slowing the time required for MP4 to reach its steady state full "on" condition.

Figure 1:
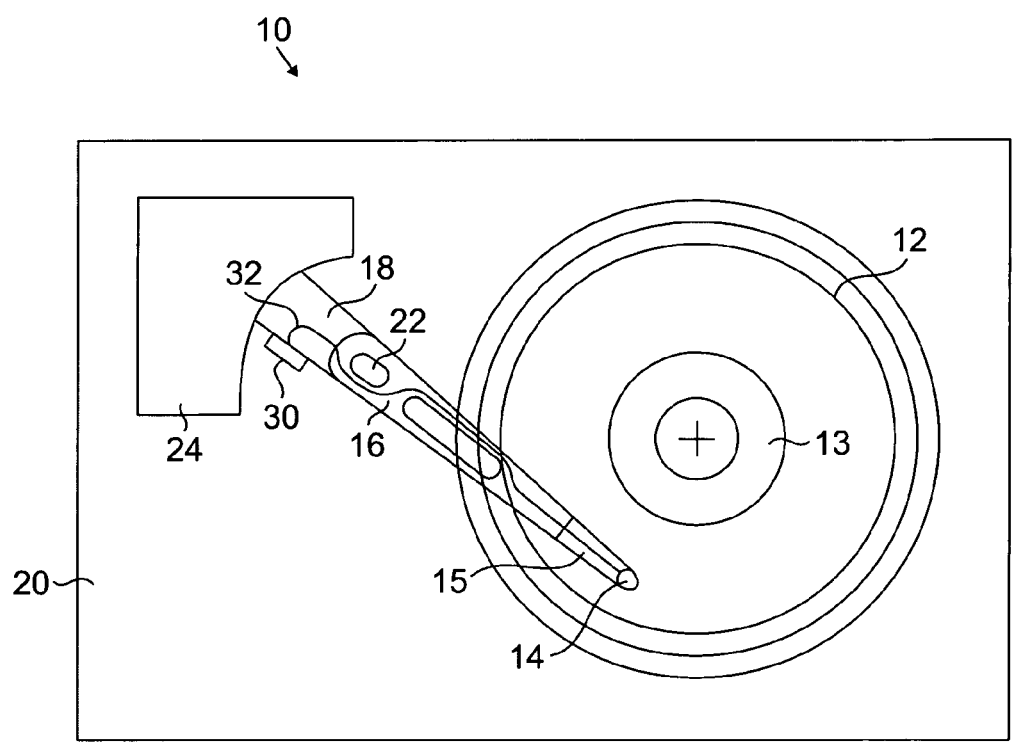
FIG. 1 illustrates a prior art disk drive to which the teachings of the present invention can be applied.
Figure 2:
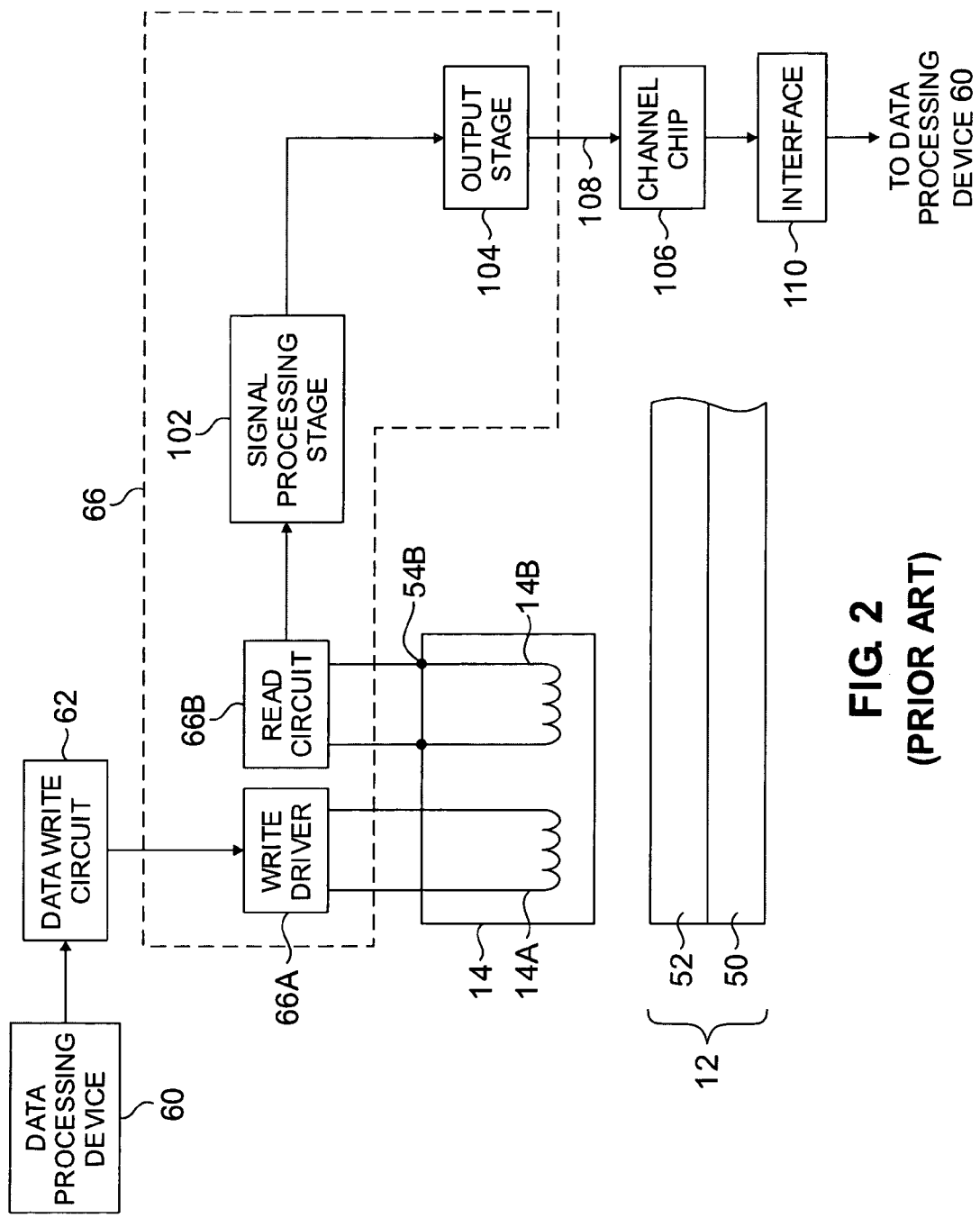
FIG. 2 is a schematic diagram of a prior art head of the disk drive of FIG. 1.

To avoid dropping bits to be written to the disk 12 of FIG. 1, the converter delay between an input voltage change and a resulting output voltage change should be a fraction of the bit cell time (bit period). As the delays, which are caused in part by the various charging and discharging events described above, approach the bit cell time, bit pattern dependent propagation delays accumulate. The pattern dependent delays are caused by bit patterns in which there is an extended interval between bit transitions. These bit patterns provide sufficient time for the gates of the MOSFETS to charge to the positive or negative rail voltages as described above (or another voltage less than the rail voltages) and thus increase the transistor switching time (delays) when a data transition occurs. Since the bit patterns are not known in advance, gate voltage initial condition when a bit transition occurs cannot be known in advance and may not be identical at the beginning of a first bit period and a second subsequent bit period, depending on the number of bit transitions and the duration between bit transitions between the first bit transition and the second bit transition For example, for a bit period T, the gate voltage on the MOSFET MN3 is different at 1T, 2T, 3T, etc. depending on whether a bit transition occurred in the first, second or third bit cells. If the delays associated with charging/charging the various gate capacitances are sufficiently long, bits are not properly processed by the converter 160 and are therefore lost, i.e., not written to the disk 12.

The converter 160 also exhibits timing skews caused by differences between the turn on and turn off timing characteristics of the PMOSFETS and the NMOSFETS. The delays described above, such as the time required for the parasitic junction capacitors of the current mirrors to discharge from their initial condition in response to a change in the input signals and further to charge to the opposite state to turn on the current mirror, are likely not the same for all MOSFETS of the converter 160, causing timing skews within the converter 160.

It is noted that the timing delays associated with the converter 160 are necessarily longer due to the use of MOSFETS, which have an inherently slower switching speed than bipolar junction transistors.

In the steady state mode, (Vout0+Vout1)/2=(VPOS+VNEG)/2 and the converter 160 is properly balanced. During data transition periods the common mode voltage should be (VPOS+VNEG)/2. However, it is difficult for the converter 160 to achieve this latter condition due to the asymmetries and the timing skews described above.

Disadvantageously, use of a single input stage (the MOSFETS MN1 and MN2 in FIG. 3 comprise a single input stage), reduces operating speed as the current has to switch from an NMOSFET input (MN1 for example) to a PMOSFET current mirror (MP4 for example) and then back to an NMOSFET current mirror (the output current mirror masters MN3 and MN5), as described above. Turning the MOSFETS on/off as the input signal changes requires the circuit to complete several, relatively slow, current mirror transitions. When used in high-speed applications, relatively large currents are utilized in the converter 160 to increase the switching speeds of the MOSFETS, but the larger currents require physically larger MOSFETS and increase power consumption of the data storage device operative with the converter 160. Also, the larger MOSFETS exhibit larger gate capacitances that further extend the capacitive-based switching delays describe above. Thus certain modifications are desired to improve the speed and symmetrical operation of the converter 160.

Figure 4:
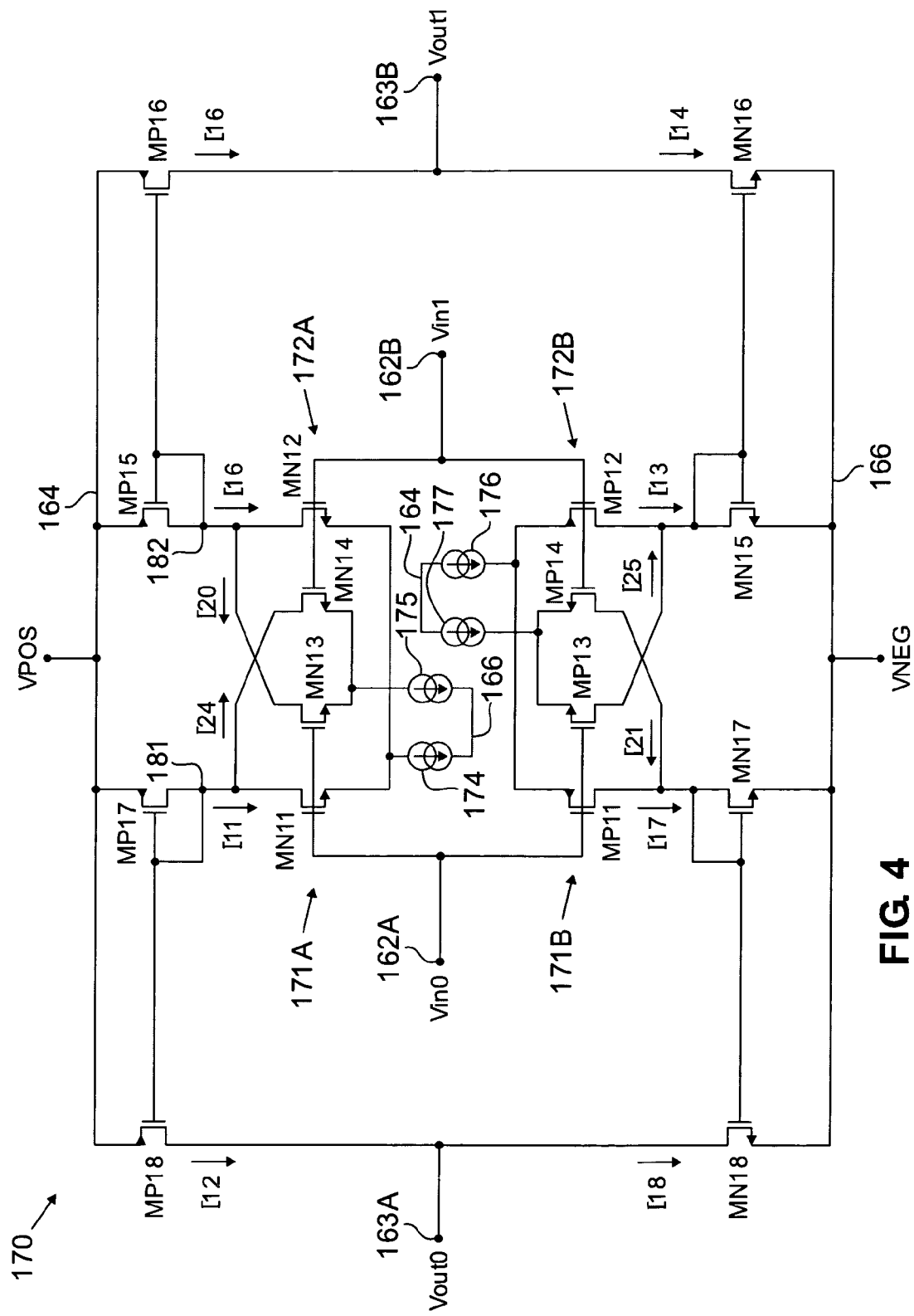
FIG. 4 is a schematic diagram of an embodiment of a differential input/differential output converter circuit of the present invention.

FIG. 4 illustrates a differential input/differential output converter 170 of the present invention that reduces signal propagation time to permit a faster transition in the output state in response to a transition in the input state. Thus the speed and operational symmetry of the converter 170 is improved over the prior art converter 160. Further, since the converter 170 comprises fewer current mirrors, the number of PMOSFET and NMOSFET mirror devices is reduced, thereby reducing the total gate capacitance of the converter 170 and further improving switching speed.

Although described in conjunction with operation in a hard disk drive storage system, the converter 170 can be utilized in other applications for converting a first differential signal having a first difference voltage to a second differential signal having a second difference voltage.

The converter 170 comprises complimentary input stages 171A and 171B responsive to the input signal Vin0 and complimentary input stages 172A and 172B responsive to the input signal Vin1. The input stage 171A comprises MOSFETS MN11 and MN13, the input stage 171B comprises MOSFETS MP11 and MP13, the input stage 172A comprises MOSFETS MN12 and MN14 and the input stage 172B comprises MOSFETS MP12 and MP14. Each one of a first differential MOSFET pair MN11 and MN12 comprises a gate terminal G connected to a respective gate terminal G of a respective one of a second differential MOSFET pair MN13 and MN14. Similarly, each one of a third differential pair MP11 and MP12 comprises a gate terminal G connected to a respective gate terminal G of a fourth third differential MOSFET pair MP13 and MP14.

According to one embodiment of the converter 170, the input MOSFETS MN13, MN14, MP13 and MP14 improve the converter's operating speed by controlling the gate voltage of respective current mirror master MOSFETS MP15, MP17, MN15 and MN17 to a defined state.

With respect to the NMOSFETS of the converter 170, a first current mirror master NMOSFET (either one of MN15 and MN17 depending on the most recent input signals applied to the input terminals 162A and 162B) is biased at a first positive gate-source voltage greater than its positive threshold voltage, and a second current mirror master NMOSFET (the other one of MN15 and MN17) is biased at a second positive voltage greater than its positive threshold voltage, where the second positive voltage is greater than the first positive voltage. Thus although both NMOSFETS are biased "on," the second NMOSFET biased at the second gate-source voltage carries a higher bias current than the first MOSFET. In one embodiment, the bias current ratio of the two NMOSFETS is about 10:1. In the present description, the bias state of the first NMOSFET is referred to as a weak threshold condition and the bias state of the second NMOSFET is referred to as a strong threshold condition. The terms "weak" and "strong" are intended only to refer to the relative threshold conditions of the two MOSFETS and are not intended to limit the threshold condition of either MOSFET to a condition that may be generally regarded as a "strong" threshold condition or a "weak" threshold condition.

As depicted in FIG. 4, the current mirror masters MN15 and MN17 carry one of two different currents responsive to the input signal, where the value of the current is determined by a supplying current source 176 or 177. When MN17 is biased to a strong threshold condition by MP11 (in response to an input condition Vin0<Vin1) a current 117 supplied by the current source 176 flows through MN 17 and through MP11. When MN 17 is biased to a weak threshold condition by MP14 (in response to an input condition Vin0>Vin1) a current I21 supplied by the current source 177 flows through MN17 and through MP14. In one embodiment the ratio of the current I17 to the current I21 is about 10:1, that is, the ratio of the current supplied by the current source 176 is about ten times greater than the current supplied by the current source 177.

Similarly, when MN15 is biased to a strong threshold condition by MP12, responsive to the input condition Vin0>Vin1, a current I13 supplied by the current source 176 flows through MP12 and MN15. When MN15 is biased to a weak threshold condition by MP13, responsive to the input condition Vin0<Vin1, a current I25 supplied by the current source 177 flows through MP13 and MN15. In one embodiment the ratio of the current I13 to the current I25 is about 10:1, that is, a ratio of the current supplied by the current source 176 to the current supplied by the current source 177 is about 10:1.

The current mirror master PMOSFETS MP17 and MP15 are similarly biased to a strong or a weak threshold condition, i.e., a first PMOSFET is biased at a first negative voltage more negative than its negative threshold voltage and a second PMOSFET is biased at a second voltage more negative than the first voltage, where the bias conditions are responsive to the input condition Vin0<Vin1 or Vin0>Vin1. Both PMOSFETS are "on," but the second PMOSFET (biased to the strong threshold condition) carries a larger bias current as supplied by a current source 174, than the first PMOSFET (biased to a weak threshold condition) carrying a smaller bias current as supplied by a current source 175. In one embodiment, the bias current ratio of the strong and the weak threshold conditions is about 10:1, as a ratio of the current supplied by the current source 174 to the current supplied by the current source 175 is about 10:1. The bias condition and thus the bias current of the PMOSFET MP17 is controlled by one of the input MOSFETS MN11 or MN14 responsive to the input signals. The bias condition of the PMOSFET MP15 is controlled by one of the input MOSFETS MN13 or MN 12 in response to the input signals.

Assuming a current ratio of 1:10 with the first current mirror master biased at about 1 V above its threshold voltage (the strong threshold condition), the second current mirror master is biased at 1 V/sqrt (10), which is about 0.316 V above its threshold voltage (the weak threshold condition). Both devices have a gate-source voltage above threshold and both are "on", but the MOSFET in the strong threshold condition has about ten times the drive current or drive strength of the MOSFET in the weak threshold condition. This large difference in drive current, which is reflected in an output current supplied by the current mirrors controlled by the current mirror masters, permits the output nodes Vout0 and Vout1 to be driven nearly to VPOS and to VNEG.

When a current mirror master MOSFET (MP15 and MP17) of the converter 170 switches from the strong to the weak threshold condition in response to an input voltage change, the gate-source voltage changes by 0.684 V (1.0-0.316). In the prior art converter 160 of FIG. 3, the gate-source voltage of the current mirror masters changes from VPOS to (VPOS-Vthreshold-1.0) (when biased at about 1 V beyond the threshold condition). Assuming Vthreshold is about 1V for a PMOS device, the gate-source voltage changes by about 2.0 V in the converter 160 compared with a change of 0.684 V in the converter 170. This is about a three fold reduction in the voltage swing at the gates of the mirror masters MP17 and MP15, allowing the converter 170 to switch much faster and thus accommodate a much higher input data rate. Similar conditions pertain to the negative threshold voltage conditions of the NMOSFET current mirror masters MN15 and MN17.

Since these gate-source voltage bias conditions reduce the time required for the current mirror master MOSFETS to reach a steady-state condition in response to an input state change, the current mirrors MP16, MP18, MN16 and MN18 controlled by the current mirror masters turn on faster to effect a faster transition in the output state in response to a transition in the input signals. In contrast, in the prior art converter circuit 160 the mirror master gate voltage is permitted to charge to the rail voltage, thus requiring additional time for the current mirror master to change state due to the delay encountered while the mirror master gate discharges from the rail voltage. By avoiding this condition where the MOSFET is biased at the rail voltage, the switching time of the mirror masters, and thus the switching time of the converter circuit of the present invention, is reduced.

A further speed reduction is realized due to fewer current mirrors in the converter 170 than in the prior art converter 160. According to the converter 160, when the MOSFET MN1 switches states, the change is propagated through or "mirrored around" the current mirror master MP4 and the current mirrors MP5 and MP6, then through the current mirror master MN5 and the current mirror MN6 to effect a change in the output state at the output terminal 163B. In the embodiment of FIG. 4, each current mirror master MOSFET MP17, MP15, MN17 and MN15 controls only a single current mirror, which in turn controls the output voltage directly.

The converter 170 operates as follows, assuming initial conditions as set forth. Assume initial conditions where the input MOSFETS MN11, MN13, MP12 and MP14 are "on," and the input MOSFETS MN12, MN14, MP11 and MP13 are "off." Thus the current mirror master PMOSFET MP17 is biased to the strong threshold condition (by the "on" MOSFET MN11 and the current supplied by the current source 174) and the PMOSFET MP15 is biased to the weak threshold condition (by the "on" MOSFET MN13 and the current supplied by the current source 175). The current I11 through MP17 as supplied by the current source 174 is about ten times greater than the current I20 through MP15 as supplied by the current source 175.

Similarly, the current mirror master NMOSFET MN17 is biased to the weak threshold condition (by the "on" MOSFET MP14 and the current supplied by the current source 177) and the NMOSFET MN15 is biased to the strong threshold condition (by the "on" MOSFET MP12 and the current supplied by the current source 176) such that a current I13 is about ten times greater than a current I21.

Given these initial conditions, assume for the next data bit to be written to the disk 12 the voltage Vin0 on the input terminal 162A exceeds the voltage Vin1 on the input terminal 162B. The input MOSFETS MN11 and MN13 maintain their "on" state, and the current I11 supplied by the current source 174 flows through the input MOSFET MN11 and the current mirror master MOSFET MP17. From the current mirror master MOSFET MP17, the current I11 is mirrored to a current mirror MOSFET MP18, where the mirrored current is referred to as a current I12 and may be a fractional ratio of the current I11.

The MOSFETS MN12 and MN14 are still gated "off" due to the differential nature of the input signal. Thus the currents I24 and I15 are substantially zero. The mirrored current I16 is substantially zero.

The cross-coupled input MOSFET MN13, which maintains its "on" state in response to the input signal Vin0, carries the current I20 from the current mirror master MP15, as supplied by the current source 175. Thus MP15 continues to be biased "on" to the weak threshold condition. I20 is less than I11; in one embodiment I11 is about ten times greater than I20. With MP15 biased "on," it can reach a strong threshold condition in response to a later input voltage change faster than the current mirror masters of the prior art converter 160 of FIG. 3. Thus the current mirror MP16 controlled by MP15 turns "on" faster to cause the output voltage to respond faster to an input voltage change.

Since the voltage on the input voltage Vin0 is greater than the input voltage Vin1, the MOSFETS MP11 and MP13 in the input stage 171B are "off." A current I17 through channel paths of MP11 and MN17 and a current I25 through a channel path of MP13 are all substantially zero. The mirrored current I18 through a MOSFET MN18 is also substantially zero.

Finally, the input MOSFETS MP12 and MP14 maintain their "on" initial condition when Vin0>Vin1, causing a current I13, supplied by the current source 176, to flow through the MOSFET MP12 and the current mirror master MOSFET MN15, gating the MOSFET MN15 to a strong threshold condition. From the MOSFET MN15, the current I13 is mirrored to a current mirror MOSFET MN16, where the mirrored current is referred to as a current I14 and may be a fractional ratio of the current I13.

Since MP14 is "on" the current I21, supplied by a current source 177, flows through the channel path of the MOSFET MP14 in the weak threshold condition.

Analyzing output conditions of the converter 170, since I12 is non-zero and I18 is substantially zero, the output terminal 162A is at the positive rail voltage VPOS. Since I14 is non-zero and I16 is substantially zero, the output terminal 162B is at the negative rail voltage VNEG. The input differential signal having a difference of Vin0−Vin1 has thus been converted to an output rail-to-rail voltage having a difference magnitude greater than the input signal difference magnitude.

Typically, the PECL data supplied to the converter 170 is level shifted to the proper common mode voltage before input to the converter 170. The level shifting ensures that the input signal voltages to the converter 170 are within the headroom constraints for the input differential pairs 171A, 171B, 172A and 172B, permitting the converter 170 to convert the high frequency PECL signal to a high frequency CMOS signal, as provided at the output terminals 162A and 162B while maintaining signal integrity.

For the input signal condition Vin0>Vin1, it is not necessary for the currents I11 and I13 to be substantially equal if the ratios of I11/I24 and I15/I20 are about equal to the ratios of I13/I25 and I17/I21, and the gain of the NMOSFET current mirrors MN15, MN16, MN17 and MN18 is the same ratio to the gain of the PMOSFET current mirrors MP15, MP16, MP17 and MP18. The gain of the current mirror master/current mirror pairs MP17/MP18, MP15/MP16, MN17/MN18, and MN15/MN16 should be selected such that the value of I16 when MP15 is in a weak threshold condition is approximately equal to the value of I14 when MN15 is in a weak threshold condition, the value of I16 when MP15 is in a strong threshold condition is approximately equal to the value of I14 when MN15 is in a strong threshold condition, the value of I12 when MP17 is in a weak threshold condition is approximately equal to the value of I18 when MN17 is in a weak threshold condition and the value of I12 when MP17 is in a strong threshold condition is approximately equal to the value of I18 when MN17 is in a strong threshold condition.

Since I14 is always mirroring current from a MOSFET in a weak threshold condition when I16 is mirroring current from a MOSFET in a strong threshold condition and vice versa, the output terminal Vout1 is driven substantially to either the VPOS or the VNEG rail voltage. Similarly, since I12 is always mirroring current from a MOSFET in a weak threshold condition when I18 is mirroring current from a MOSFET in a strong threshold condition and vice versa, the output terminal Vout0 is driven substantially to either the VPOS or VNEG rail voltage.

These conditions provide an output drive current for the NMOSFET current mirrors that is about equal to the output drive current for the PMOSFET current mirrors.

When the input voltage Vin1 is greater than the voltage Vin0, the state of the input MOSFETS switch with the input MOSFETS MN12 and MN14 and the input MOSFETS MP11 and MP13 switching "on," while the input MOSFETS MN11, MN13, MP12 and MP14 switch "off." In response, the currents I11, I20, I13 and I25 decrease to substantially zero.

In response to the MOSFET MN12 switching "on," the current mirror master MOSFET MP15 transitions from a weak threshold condition with the current I20 through MP15 and MN13, to a strong threshold condition with the current I15 through MP15 and MN12. Since the input voltage causes MN13 to switch "off," the current I20 goes to zero. The transition of MP15 from a weak to a strong threshold condition is accomplished faster than in the prior art converter 160 of FIG. 6 due to the initial weak threshold state for MP15.

The current I15 through MN12 and MP15 is mirrored to MP16 to create the mirror current I16.

Similarly, in response to the MOSFET MP11 switching "on" and the MOSFET MP14 switching "off," the current mirror master MOSFET MN17 transitions from a weak threshold condition to a strong threshold condition. The current I17 through MP11 and MN17, as supplied by the current source 176, is mirrored to the current mirror MN18 for creating the current I18.

When MN11 switches "off" and MN14 switches "on," the current mirror master MP17 transitions from a strong threshold condition to a weak threshold condition as determined by the gate bias applied through MN14. Bias current I24 supplied by the current source 175 flows through MP17 and MN14. In one embodiment the current I24 is about 10% of the current I15.

When MP12 switches "off" and MP13 switches "on," the current mirror master MN15 transitions from a strong threshold condition to a weak threshold condition as determined by the gate bias applied through MP13. Bias current I25 supplied by the current source 177 flows through MP17 and MN14. In one embodiment, the current I25 is about 10% of the current I17.

Under these conditions, the output signal Vout0 is substantially equal to VNEG on the negative voltage rail 166 and the output signal Vout1 is substantially equal to the voltage VPOS on the positive voltage rail 164.

The currents I20, I21, I24 and I25 can be many times smaller (one-tenth in one embodiment) than the currents I11, I13, I15 and I17. With a reduced current demand, the MOSFETS MN13, MN14, MP13 and MP14 can be physically smaller than the MOSFETS MN11, MN12, MP11 and MP12.

Use of the complementary input stages 171A, 171B, 172A and 172B, the converter 170 permits switching of the NMOSFET current mirrors (i.e., current mirrors comprising NMOSFETS) at substantially the same time as the PMOSFET current mirrors are switched. According to the prior art converter 160 of FIG. 3, the NMOSFET current mirrors are switched first followed by a time delay before the PMOSFET devices are switched (or vice versa).

Preferably, MN11, MN12, MN13 and MN14 are scaled to reduce a capacitance at a node 181 connected to a drain D of MN11 and a drain D of MN14, and at a node 182 connected to a drain D of MN13 and a drain D of MN12. For example, if the current source 174 supplies a current about eight times larger than the current supplied by the current source 175, a length of a channel for MN11, MN12, M13 and MN14 should be substantially identical, a channel width of MN13 and MN14 should be substantially identical, and a channel width of MN11 and MN12 should be about eight times larger than the channel width of MN13 and MN14. These preferred dimensions minimize the drain capacitance of MN13 and MN14, thereby reducing the total capacitance at the nodes 181 and 182. Channels of the MOSFETS MP11, MP12, MP13 and MP14 should be similarly sized to limit capacitance at nodes 183 and 184.

It is known that the bias condition of a MOSFET is determined by a gate-to-source voltage Vgs, a drain current Id, and a drain-to-source voltage Vds. MP17, for example, according to the present invention is operated in a saturation condition, where the drain current is simplified to:

$$Id = k*(Vgs-Vt)*(Vgs-Vt)$$

which can also be rewritten as:

$$Vgs = sqrt(Id/k) + Vt$$

where Id is the MOSFET drain current, k=(u*Cox/2)*(W/L) with the first term being a constant set by a process technology according to which he MOSFET is fabricated, W is the MOSFET channel width, L is the MOSFET channel length, and Vt is the threshold voltage, which is also determined by the process technology. When the MOSFET operates in saturation, the Vds term can be eliminated. Vds affects the output resistance of the MOSFET, and therefore the operating point, but this term is generally very small for devices operating in the saturation region and can therefore be omitted.

Thus for the MOSFET MP17, the gate-to-source voltage is given by $$Vgs = sqrt((174,175)/k) + Vt$$

where the Id term is replaced with the current supplied by either the current source 174 for the input condition Vin0>Vin1 or the current supplied by the current source 175 for Vin0<Vin1. The steady state operating point for MP17 is determined by one of the current sources 174 or 175 depending on the relation between the input signals Vin0 and Vin1.

Figure 5:
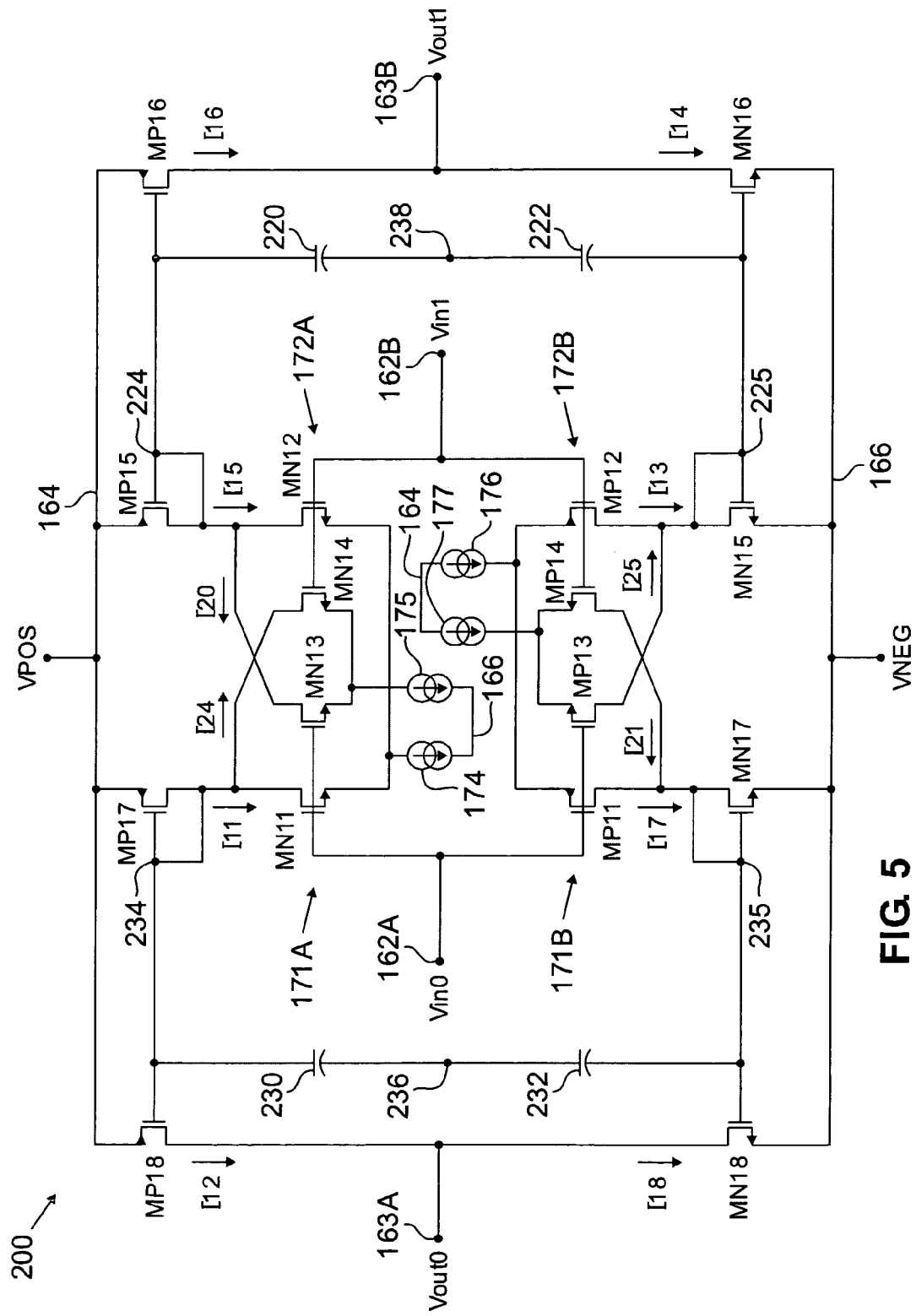
FIG. 5 is a schematic diagram of another embodiment of a differential input/differential output converter circuit of the present invention.

In another embodiment, a converter circuit 200 of FIG. 5 further comprises a boost circuit 202 (see FIG. 6) to further increase operating speed. The boost circuit 202 comprises boost voltage output terminals 203A and 203B that are connected directly to gates of the current mirror master and current mirror MOSFETS of the converter circuit 200 through coupling capacitors. The boost circuit 202 supplies a voltage for overdriving the gates of the current mirror and current mirror master MOSFETS to further accelerate transitions of the current mirrors.

The boost circuit 202 operates in conjunction with serially connected capacitors 220 and 222 (see FIG. 5) connected between nodes 224 and 225 of the converter circuit 200, and serially-connected capacitors 230 and 232 connected between the nodes 234 and 235. The boost voltage output terminal 203A of the boost circuit 202 is connected to the converter circuit 200 at a node 236 disposed between the capacitors 220 and 222. The boost voltage output terminal 203B is connected to the converter circuit 200 at a node 238 disposed between the capacitors 230 and 232. The boost circuit 202 improves a switching speed of the converter circuit 200 and thus permits effective operation of the differential input/differential output converter circuit 200 at higher data rates.

For example, to substantially turn "off" the current mirror MOSFET MP16 such that Vout1 is pulled to the voltage on the negative voltage rail 166, the gate of the MOSFET MP16 is driven to a higher voltage via the capacitor 220 (see FIG. 5) by a voltage supplied at the boost voltage output terminal 203B and connected to the converter 200 at the node 238.

Conversely, for Vout1 to go high (i.e., to the voltage on the positive voltage rail 164), it is desired to pull the gate of the MOSFET MP16 down hard to force the MOSFET MP16 to turn "on" faster. The boost voltage output terminal 203B also provides a signal to the capacitor 220 to accomplish this.

Figure 6:
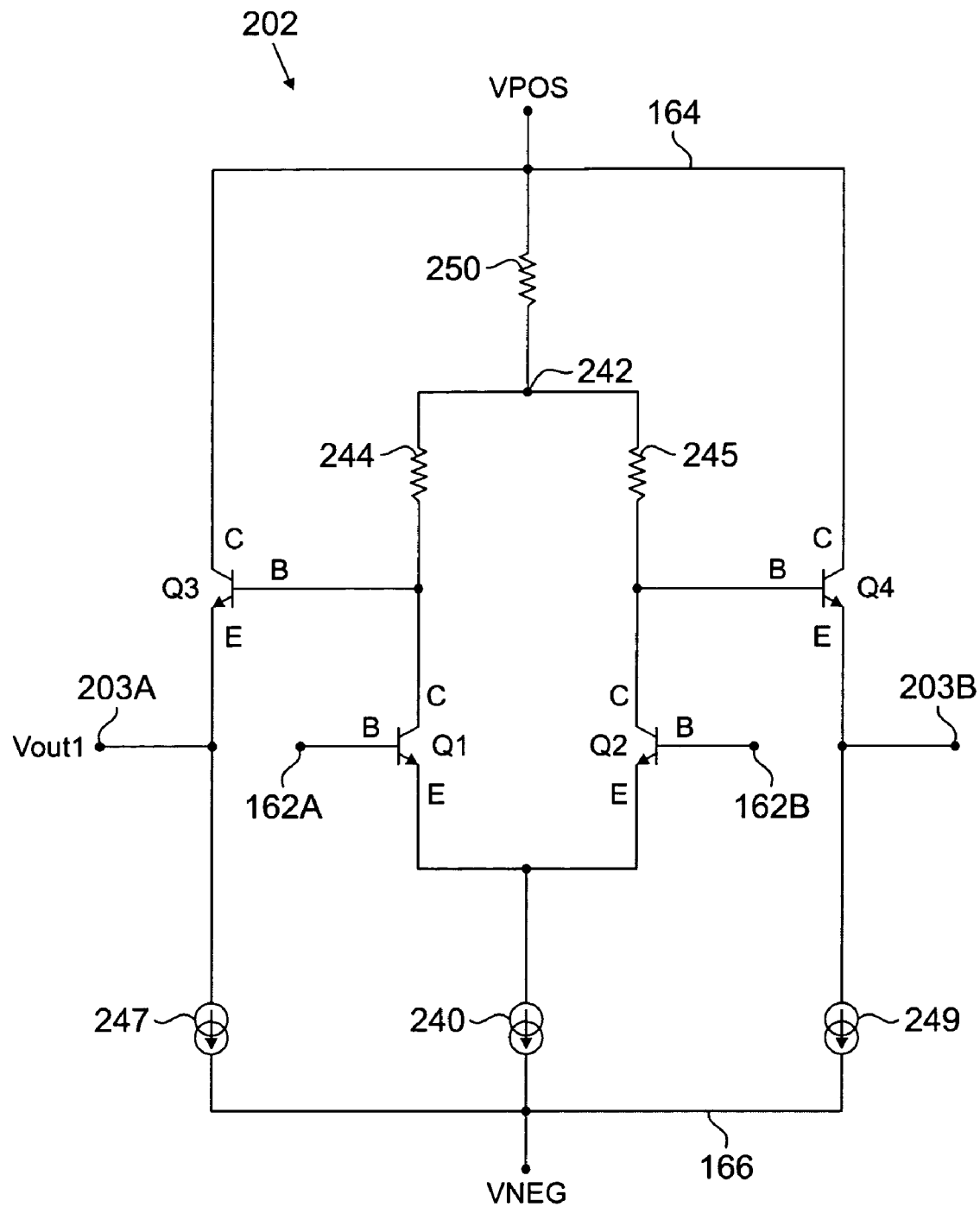
FIG. 6 is a schematic diagram of a boost circuit for use in conjunction with the differential input/differential output converter circuit of FIG. 5.

As illustrated in FIG. 6, the boost circuit 202 comprises a differential transistor pair comprising NPN bipolar junction transistors Q1 and Q2 each having an emitter E connected to the negative voltage rail 166 via a current source 240, and a base B connected to the input terminals 162A and 162B of the converter circuit 200, respectively. A collector C of each transistor Q1 and Q2 is connected to a node 242 via resistors 244 and 245, respectively. In one embodiment the boost circuit 202 comprises bipolar junction transistors that can be fabricated with the MOSFETS of the converter circuit 200 according to known BiCMOS processes.

Bipolar junction transistors Q3 and Q4 are configured as emitter followers, each having a base B connected to a collector C of the transistors Q1 and Q2, respectively and an emitter E connected to the negative voltage rail 166 through a current source 247 and 249, respectively, wherein the emitter follower configuration provides the necessary drive current to the boost voltage output terminals 203A and 203B.

The transistors Q3 and Q4 are supplied with drive current by respective current sources 247 and 249, with the state of each transistor Q3 and Q4 controlled by the state of the respective transistor Q1 and Q2 responsive to the input voltage. When Vin0>Vin1, the transistor Q1 is "on" and the transistor Q2 is "off." The base of Q3 is driven low and the Q3 emitter is driven to the negative rail voltage VNEG. The negative boost voltage at the boost voltage output terminal 203A is coupled to the node 234 (see FIG. 5) via the node 236 and the capacitor 230 to accelerate driving the MOSFETS MP17 and MP18 into a hard conductive state. The negative voltage at the node 236 is also supplied to the MOSFETS MN17 and MN18, driving them to an "off" condition, consistent with the input condition Vin0>Vin1.

Similarly, the boost voltage output terminal 203B is driven to the positive rail voltage VPOS and supplied to the converter 200 via the node 238. The positive voltage is coupled to the MOSFETS MP15 and MP16, via the capacitor 220, to drive the MOSFETS MP15 and MP16 to the "off" state.

For the input condition Vin0<Vin1, the boost voltages are reversed from the illustrated example to drive the MOSFETS to the opposite condition and accelerate the transition in the output voltage in response to the transition in the input voltage.

A resistor 250 connected between the positive voltage rail 164 and the node 242 adjusts the common mode differential of the signal supplied on the boost voltage output terminals 203A and 203B. The common mode differential level of the boost voltage output signals may be advantageous to maintain substantially the same effective capacitance value among the capacitors 220, 222, 240 and 242, as many capacitors implemented as junction capacitors in an integrated circuit possess a voltage coefficient that causes the capacitance to vary as function of the voltage applied across the capacitor. If the capacitors 220, 222, 240 and 242 are physically implemented using a device that does not exhibit a voltage coefficient (e.g., two parallel conductive plates separated by a dielectric) the resistor 250 may not be required.

The resistor 244 determines current flow through the transistor Q1 as supplied by the current source 240 when the transistor Q1 is in an "on" state. Similarly, the resistor 245 determines the current flow through the transistor Q2. Thus, the resistors 244 and 245 determine the differential boost signal swing. The boost output voltage at the terminal 203A is connected to the node 236 of the converter 200 to supply the boost voltage to the nodes 234 and 235 via the capacitors 230 and 232, respectively. The boost output voltage at the terminal 203B is connected to the node 238 of the converter 200 to supply the boost voltage to the nodes 224 and 225 via the capacitors 220 and 222. In response to a change in the relative voltage of the input signals supplied to the boost circuit 202 via the input terminals 162A and 162B, the boost voltages supplied by the boost circuit 202 to the respective gates of the current mirror masters MP15, MP17, MN15 and MN17 and the current mirrors MP16, MP18, MN16 and MN18 accelerate the switching time of these MOSFETS.

In another embodiment, one or more of the MOSFETS and BJTS as described in the various embodiments herein is replaced by an opposite polarity MOSFET or BJT. The associated gate/base drive signals and power supply voltages are modified to accommodate the doping characteristics of the opposite polarity MOSFET or BJT, while providing the functionality of the present invention. Further, throughout the description of the present invention, the phrase, 'high' signal value is used interchangeably with a 'true' or an 'asserted' state. Those skilled in the art recognize that other signal values can also be associated with a 'true' or an 'asserted' logic state with a corresponding change in the device responsive to the logic state.

An apparatus and method have been described as useful for converting the voltage value of digital pulses from a first voltage to a second (e.g., higher) voltage. Specific applications and exemplary embodiments of the invention have been illustrated and discussed. These provide a basis for practicing the invention in a variety of ways and in a variety of circuit structures. Numerous variations are possible within the scope of the invention. Features and elements associated with one or more of the described embodiments are not to be construed as required elements for all embodiments. The invention is limited only by the claims that follow.

What is claimed is:

1. A voltage converter responsive to a differential input signal comprising a first and a second input signal, the converter for producing a differential output signal in response to the differential input signal, the converter comprising:

a first input module responsive to the first and the second input voltages;

a second input module responsive to the first and the second input voltages;

a first and a second current supplying module, the first input module biases the first current supplying module at a first bias current through the first current supplying module and biases the second current supplying module at a second bias current through the second current supplying module, wherein the first current is greater than the second current;

a third and a fourth current supplying module, wherein the second input module biases the third current supplying module at a third bias current through the third current supplying module and biases the fourth current supplying module at a fourth bias current through the fourth current supplying module, wherein the fourth current is greater than the third current; and wherein the differential output voltage comprises a first and a second output voltage responsive to the first, second, third and fourth currents.

2. The voltage converter of claim 1 wherein the first bias current and the fourth bias current comprise a strong threshold condition for the respective first and fourth current supplying modules, and wherein the second bias current and the third bias current comprise a weak threshold condition for the respective second and third current supplying modules.

3. The voltage converter of claim 1 wherein a ratio of the first current to the second current is about 10:1 and a ratio of the fourth current to the third current is about 10:1.

4. The voltage converter of claim 1 further comprising first, second, third and fourth current mirrors each providing a respective first, second, third and fourth mirror current, wherein the first output terminal is disposed between the first and the third current mirrors and the second output terminal is disposed between the second and the fourth current mirrors, and wherein each one of the first, second, third and fourth current supplying modules controls the respective first, second, third and fourth current mirror, and wherein the first output voltage is responsive to the first and the third mirror currents, and wherein the second output voltage is responsive to the second and the fourth mirror currents.

5. The voltage converter of claim 1 wherein the first, the second, the third and the fourth current supplying modules each comprises a respective first, second, third and fourth current mirror master MOSFET each in an "on" condition in response to the respective first, second, third and fourth bias currents.

6. The voltage converter of claim 5 wherein the "on" condition of the first and the fourth current mirror master MOSFETS supports a larger bias current than the "on" condition of the second and the third current mirror master MOSFETS.

7. The voltage converter of claim 1 wherein the first input module comprises a first and a second NMOSFET each having a first source/drain responsive to a first current source, and further comprises a third and a fourth NMOSFET each having a first source/drain responsive to a second current source, the first current source supplying a larger current than the second current source, a gate of the first and the third NMOSFETS responsive to the first input voltage and a gate of the second and the fourth NMOSFETS responsive to the second input voltage, a second source/drain of each of the first and the fourth NMOSFETS connected to the first current supplying module and a second source/drain of each of the second and the third NMOSFETS connected to the second current supplying module.

8. The voltage converter of claim 1 wherein the second input module comprises a first and a second PMOSFET each having a first source/drain responsive to a first current source, and further comprises a third and a fourth PMOSFET each having a first source/drain responsive to a second current source, the first current source supplying a larger current than the second current source, a gate of the first and the third PMOSFETS responsive to the first input voltage and a gate of the second and the fourth PMOSFETS responsive to the second input voltage, a second source/drain of the first and the fourth PMOSFETS connected to the third current supplying module and a second source/drain of the second and the third PMOSFETS connected to the fourth current supplying module.

9. The voltage converter of claim 1 wherein the first input module comprises a first differential MOSFET pair further comprising a first and a second MOSFET and a second differential MOSFET pair further comprising a third and a fourth MOSFET, wherein in response to a first state of the first input voltage the first MOSFET controls the first current supplying module and the third MOSFET controls the second current supplying module, and wherein in response to a first state of the second input voltage the fourth MOSFET controls the second current supplying module and the third MOSFET controls the first current supplying module.

10. The voltage converter of claim 9 wherein the first and the third MOSFETS are in an "off" condition in response to a second state of the first input voltage and the second and the fourth MOSFETS are in an "off" condition in response to a second state of the second input voltage.

11. The voltage converter of claim 9 wherein a gate of the first MOSFET and a gate of the third MOSFET are responsive to the first input voltage and a gate of the second MOSFET and a gate of the fourth MOSFET are responsive to the second input voltage, and wherein a source/drain of the first MOSFET and a source/drain of the fourth MOSFET are responsive to a first current source, and wherein a source/drain of the second MOSFET and a source/drain of the third MOSFET are responsive to a second current source, and wherein the first current source supplies the first bias current and wherein the second current source supplies the second current.

12. The voltage converter of claim 1 wherein the second input module comprises a first differential MOSFET pair further comprising a first and a second MOSFET and a second differential MOSFET pair further comprising a third and a fourth MOSFET, wherein in response to a first state of the first input voltage the first MOSFET controls the first current supplying module and the third MOSFET controls the second current supplying module, and wherein in response to a first state of the second input voltage the fourth MOSFET controls the second current supplying module and the fourth MOSFET controls the first current supplying module.

13. The voltage converter of claim 12 wherein the first and the third MOSFETS are in an "off" condition in response to a second state of the first input voltage and the second and the fourth MOSFETS are in an "off" condition in response to a second state of the second input voltage.

14. The voltage converter of claim 12 wherein a gate of the first MOSFET and a gate of the second MOSFET are responsive to the first input voltage and a gate of the third MOSFET and a gate of the fourth MOSFET are responsive to the second input voltage, and wherein a source/drain of the first MOSFET and a source/drain of the second MOSFET are responsive to a first current source supplying a first current, and wherein a source/drain of the third MOSFET and a source/drain of the fourth MOSFET are responsive to a second current source supplying a second current.

15. The voltage converter of claim 1 further comprising first, second, third and fourth current sources for supplying the respective first, second, third and fourth currents.

16. The voltage converter of claim 1 further comprising a boost circuit for providing a first and a second boost bias signal, responsive to the first and the second input voltages, for biasing at least two of the first, second, third and fourth current supplying modules.

17. The voltage converter of claim 16 wherein a bias provided by the boost circuit is additional to a bias provided by the first and the second input modules.

18. The voltage converter of claim 16 wherein the boost circuit comprises a first transistor differential pair, a first transistor of the differential pair responsive to the first input signal and a second transistor of the differential pair responsive to the second input signal, and wherein the first transistor controls a third transistor for producing the first boost bias signal and the second transistor controls a fourth transistor for producing the second boost bias signal.

19. The voltage converter of claim 1 wherein first, second, third and fourth current supplying modules each comprise a current mirror master.

20. A voltage converter responsive to a differential input signal comprising a first and a second input signal, the converter for producing a differential output signal in response to the differential input signal, the converter comprising:
a first differential transistor pair comprising a first and a second transistor;
a second differential transistor pair comprising a third and a fourth transistor;
a third differential transistor pair comprising a fifth and a sixth transistor;
a fourth differential transistor pair comprising a seventh and an eighth transistor;
a first current source supplying a first current;
a second current source supplying a second current;
first, second, third and fourth current mirror master transistors;
first, second, third and fourth current mirrors responsive respectively to the first, second, third and fourth current mirror masters;
wherein in response to a first state of the first input signal the first transistor controls the first current mirror master transistor to a first threshold condition with the first current therethrough and the third transistor controls the second current mirror master transistor to a second threshold condition with the second current therethrough;
wherein in response to a first state of the second input signal the sixth transistor controls the fourth current mirror master transistor to the first threshold condition with the first current therethrough and the eighth transistor controls the third current mirror master transistor to the second threshold condition with the second current therethrough;
wherein the current mirror master transistors in the first threshold condition are biased to support a greater bias current than a bias current of the current mirror master transistors in the second threshold condition; and
wherein the differential output voltage comprises a first and a second output voltage responsive to first, second, third and fourth currents produced respectively by the first, second, third and fourth current mirrors.

21. The voltage converter of claim 20 wherein the first, second, third and fourth transistors each comprises an NMOSFET and wherein the fifth, sixth, seventh and eighth transistors each comprises a PMOSFET.

22. The voltage converter of claim 20 wherein the first current is greater than the second current.

23. The voltage converter of claim 20 further comprising a boost module to supply a voltage, responsive to the first and the second input signals, to one or more of the first, second, third and fourth current mirror master transistors and one or more of the first, second, third and fourth current mirrors to accelerate a transition in a state of the first, second, third and fourth current mirror master transistors and the first, second, third and fourth current mirrors in response to a transition in the differential input signal.

24. A circuit for controlling a first and a second current mirror master in response to an input voltage having a first or a second state, the circuit comprising:
a first transistor having a control terminal responsive to the input voltage and a current path therethrough;
a first current source supplying a first current through the current path of the first transistor;
a second transistor having a control terminal responsive to the input voltage and a current path therethrough;
a second current source supplying a second current through the current path of the second transistor; and
wherein in response to the first state of the input voltage the first transistor biases the first current mirror master at a first voltage permitting the first current to flow through the first current mirror master and the second transistor biases the second current mirror master at a second voltage permitting the second current to flow through the second current mirror master, and wherein the first current is greater than the second current.

25. The circuit of claim 24 wherein the first and the second current mirror masters are in an "on" condition, and wherein the first current mirror master supports a lager bias current than a bias current of the second current mirror master.

26. The circuit of claim 24 wherein the first and the second current mirror masters have a threshold voltage, and wherein a difference between the first voltage and the threshold voltage is greater than a difference between the second voltage and the threshold voltage.

27. The circuit of claim 24 further comprising;
a third transistor having a control terminal responsive to the input voltage and a current path therethrough for carrying the second current;
a fourth transistor having a control terminal responsive to the input voltage and a current path therethrough for carrying the first current;
wherein in response to an input voltage transition from the first to the second state the third transistor biases the first current mirror master at the second voltage permitting the second current to flow therethrough and the fourth transistor biases the second current mirror master at the first voltage permitting the first current to flow therethrough.

28. The circuit of claim 24 wherein the first and the second current mirror masters each comprises a MOSFET having a first source/drain terminal connected to a power supply, and a gate terminal connected to a second source/drain terminal, and wherein a channel path through the first and the second current mirror masters is in series with a respective channel path through the first and the second transistors.

29. A voltage converter responsive to a differential input voltage comprising a first and a second input voltage, the converter for producing a differential output voltage, the converter comprising:
a first input module responsive to the first and the second input voltages, the first module comprising a first submodule responsive to the first input signal and a second submodule responsive to the second input signal;
a second input module responsive to the first and the second input voltages, the second module comprising a third submodule responsive to the first input signal and a fourth submodule responsive to the second input signal;

first, second, third and fourth current mirror masters responsive to respectively, the first, second, third and fourth submodules;

wherein when the first and the fourth submodules are in an "on" condition in response to the first and the second input voltages the second and the third submodules are in an "off" condition, and wherein the first submodule controls the first current mirror master to a first threshold condition and controls the second current mirror master to a second threshold condition, and wherein the fourth submodule controls the third current mirror master to the second threshold condition and controls the fourth current mirror master to the first threshold condition; and wherein the differential output voltage comprises a first and a second output voltage responsive to a threshold condition of the first, second, third and fourth current mirror masters.

30. The voltage converter of claim 29 wherein when the first and the fourth submodules are in an "off" condition in response to the first and the second input voltages the second and the third submodules are in an "on" condition, and wherein the second submodule controls the first current mirror master to the second threshold condition and controls the second current mirror master to the first threshold condition, and wherein the third submodule controls the third current mirror master to the first threshold condition and controls the fourth current mirror master to the second threshold condition.

31. The voltage converter of claim 29 further comprising first and second current mirrors serially connected at a first node, and third and fourth current mirrors serially connected at a second node, wherein the first, second, third and fourth current mirrors are respectively responsive to the first, the second, the third and the fourth current mirror masters, wherein the first output voltage is provided at the first node responsive to current through the first and the second current mirrors and the second output voltage is provided at the second node responsive to current through the third and the fourth current mirrors.

32. The voltage converter of claim 29 further comprising a first current source supplying a first current to the first current mirror master in the first threshold condition and a second current source supplying a second current to the second current mirror master in the second threshold condition, wherein the first current is greater than the second current.

33. A preamplifier responsive to a differential input signal representing data bits stored on a magnetic storage medium, the differential input signal comprising a first and a second input signal, the preamplifier for producing a differential output signal in response to the differential input signal, the preamplifier comprising:

a first, a second, a third and a fourth differential transistor pair each responsive to the first and the second input signals;

a first current source supplying a first current;

a second current source supplying a second current, wherein the first current is greater than the second current;

first and second current mirror masters responsive to one of the first and second differential pairs;

third and fourth current mirror masters responsive to one of the third and fourth differential pairs;

first, second, third and fourth current mirrors that each supply a current responsive to a current through the first, the second, the third and the fourth current mirror masters;

wherein in response to a first state of the first input signal concurrent with a first state of the second input signal, the first differential pair controls the first current mirror master to a first threshold condition, the second differential pair controls the second current mirror master to a second threshold condition, the third differential pair controls the fourth current mirror master to the first threshold condition and the fourth differential pair controls the third current mirror master to the second threshold condition, and wherein the first current source supplies the first current through the first and the fourth current mirror masters and the second current source supplies the second current through the second and the third current mirror masters;

wherein in response to a second state of the first input signal concurrent with a second state of the second input signal the first differential pair controls the second current mirror master to the first threshold condition, the second differential pair controls the first current mirror master to the second threshold condition, the third differential pair controls the third current mirror master to the first threshold condition and the fourth differential pair controls the fourth current mirror master to the second threshold condition, and wherein the first current source supplies the first current through the second and the third current mirror masters and the second current source supplies the second current through the first and the fourth current mirror masters; and wherein the differential output voltage comprises a first output voltage responsive to the current supplied by the first and the third current mirrors and comprises a second output voltage responsive to the current supplied by the second and the fourth current mirrors.

34. The preamplifier of claim 33 wherein each of the first and the second differential transistor pairs comprises a first and a second differentially connected NMOSFET, and wherein each of the third and the fourth differential transistor pairs comprises a first and a second differentially connected PMOSFET.

35. The preamplifier of claim 33 further comprising a boost module to supply a voltage, responsive to the first and the second input signals, to one or more of the first, second, third and fourth current mirror masters and one or more of the first, second, third and fourth current mirrors to accelerate a transition in a state of the first, second, third and fourth current mirror masters and a state of the first, second, third and fourth current mirrors responsive to a transition in the differential input signal.

36. The preamplifier of claim 33 further comprising a first supply voltage connected to the first and the second current mirrors and a second power supply voltage connected to the third and the fourth current mirrors, wherein in response to the first current through the first and the fourth current mirror masters the first output voltage is substantially equal to the first power supply voltage and the second output voltage is substantially equal to the second power supply voltage, and wherein in response to the first current through the second and the third current mirror masters the first output voltage is substantially equal to the second power supply voltage and the second output voltage is substantially equal to the first power supply voltage.

37. The preamplifier of claim 33 wherein the first current biases two of the first, the second, the third or the fourth current mirror master at a first threshold condition and the second current biases two of the first, the second, the third or the fourth current mirror master at a second threshold condition, and wherein a difference between a threshold voltage of the first, the second, the third and the fourth current mirror masters and a voltage of the first threshold condition is greater than a difference between the threshold voltage and a voltage of the second threshold condition.

38. A method for controlling a first and a second current mirror master transistor in response to an input signal, comprising:
- responsive to a first state of the input signal, biasing the first transistor to a first "on" condition to supply a first current and biasing the second transistor to a second "on" condition to supply a second current, wherein the first current is larger than the second current; and
- responsive to a second state of the input signal, biasing the first transistor to the second "on" condition to supply the second current and biasing the second transistor to the first "on" condition to supply the first current.

39. The method of claim 38 wherein the first and the second transistors exhibit a threshold voltage, wherein a difference between the threshold voltage and a voltage of the first "on" condition is greater than a difference between the threshold voltage and a voltage of the second "on" condition.

40. The method of claim 38 further comprising:
- providing a bias boost signal to the first transistor responsive to the first state of the input signal and providing a bias boost signal to the second transistor responsive to the second state of the input signal.

41. A method for controlling a voltage converter responsive to a differential input signal for producing a differential output signal in response thereto, comprising:
- responsive to a first state of the differential input signal, controlling a first and a fourth current supplying module to a first "on" condition with a first current through the first and the fourth modules and controlling a second and a third current supplying module to a second "on" condition with a second current through the second and the third modules, wherein the first current is larger than the second current;
- producing the differential output signal having a first state responsive to the condition of the first, second, third and fourth current supplying modules;
- responsive to a second state of the differential input signal, controlling the first and the fourth modules to the second "on" condition with the second current through the first and the fourth modules and controlling the second and the third modules to the first "on" condition with the first current through the second and the third modules; and
- producing the differential output signal having a second state responsive to the condition of the first, second, third and fourth current supplying modules.

42. The method of claim 41 wherein the first, the second, the third and the fourth current supplying modules each comprises a transistor each having a threshold voltage, wherein a difference between the threshold voltage and a voltage of the first "on" condition is greater than a difference between the threshold voltage and a voltage of the second "on" condition.

* * * * *